United States Patent
Kraus et al.

(10) Patent No.: US 8,835,961 B2
(45) Date of Patent: Sep. 16, 2014

(54) INDEX-MATCHED INSULATORS

(71) Applicant: Intermolecular, Inc., San Jose, CA (US)

(72) Inventors: Philip Kraus, San Jose, CA (US);
Minh-Huu Le, San Jose, CA (US);
Sandeep Nijhawan, Los Altos, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/648,786

(22) Filed: Oct. 10, 2012

(65) Prior Publication Data

US 2014/0034957 A1  Feb. 6, 2014

Related U.S. Application Data

(60) Provisional application No. 61/678,782, filed on Aug. 2, 2012.

(51) Int. Cl.
*H01L 33/60* (2010.01)

(52) U.S. Cl.
USPC .......................................................... 257/98

(58) Field of Classification Search
USPC ...................................... 257/98, 99
See application file for complete search history.

(56) References Cited

U.S. PATENT DOCUMENTS

| | | | |
|---|---|---|---|
| 6,630,689 B2 | 10/2003 | Bhat et al. | |
| 2008/0006840 A1* | 1/2008 | Camras et al. | 257/98 |
| 2009/0267105 A1* | 10/2009 | Yu et al. | 257/99 |
| 2010/0219767 A1 | 9/2010 | Pumyea et al. | |

FOREIGN PATENT DOCUMENTS

WO    2011018746 A1    2/2011

OTHER PUBLICATIONS

Schubert, E.Fred; Light Emitting Diodes; 2006; Cambridge University Press; Second Edition, Chapters 10.1 and 10.3, 17 pages.

* cited by examiner

*Primary Examiner* — Matthew W Such
*Assistant Examiner* — Warren H Kilpatrick

(57) ABSTRACT

Devices are described including a first component and a second component, wherein the first component comprises a Group III-N semiconductor and the second component comprises a bimetallic oxide containing tin, having an index of refraction within 15% of the index of refraction of the Group III-N semiconductor, and having negligible extinction coefficient at wavelengths of light emitted or absorbed by the Group III-N semiconductor. The first component is in optical contact with the second component. Exemplary bimetallic oxides include $Sn_{1-x}Bi_xO_2$ where $x \cong 0.10$, $Zn_2SnO_2$, $Sn_{1-x}Al_xO_2$ where $x \cong 0.18$, and $Sn_{1-x}Mg_xO_2$ where $x \cong 0.16$. Methods of making and using the devices are also described.

12 Claims, 1 Drawing Sheet

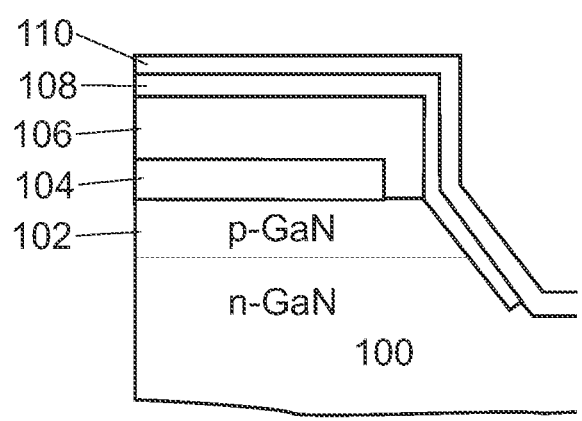

INDEX-MATCHED INSULATORS

CROSS-REFERENCE TO RELATED APPLICATIONS

This Application claims priority to U.S. Provisional Application No. 61/678,782, filed Aug. 2, 2012, which is incorporated by reference herein in its entirety.

FIELD OF THE INVENTION

One or more embodiments of the present invention relate to materials having an index of refraction matched to GaN semiconductors and structures made from the materials.

BACKGROUND

Many optoelectronic devices such as LEDs are based on wide bandgap semiconductors, such as Group III-N semiconductors (e.g. GaN and its alloys with other Group III-N semiconductors). These devices have enabled new applications based on structures that use light with wavelengths in the blue to near-UV. The GaN semiconductor has an index of refraction n≅2.3. This is high compared to both air (n=1), and commonly used transparent insulators such as $SiO_2$ (n=1.5) and $Al_2O_3$ (n=1.8). $TiO_2$ is has an index of refraction which is too high at relevant wavelengths at about 3.2. ZnS is frequently used as a "high-index" optical material which is often quoted as having an index of refraction of 2.3 (at 632 nm), but it is unsuitable at lower wavelengths, both because the index of refraction is much higher, and because the absorption increases with decreasing wavelength. The net result is that there is often poor index matching at material boundaries for wide bandgap semiconductor optoelectronic devices, with associated reflective losses at the boundaries.

Silicon nitrides of varying stoichiometry are often used with GaN. $Si_3N_4$ has a nominal index of refraction of about 2.1 and by varying the stoichiometry, the index of refraction can be tuned over a range from about 1.8 to 2.5; however variations in the stoichiometry also affect the extinction coefficient such that typically absorption of light is increased for wavelengths in the ultraviolet and visible portions of the electromagnetic spectrum. There is a need for insulating materials which have indices of refraction close to that of GaN and also where the extinction coefficient for the material is negligible.

Flip chip blue LEDs have both n- and p-contacts on the same side of the chip, and therefore these two contacts need to be isolated from each other. An insulator commonly used today is silicon nitride ($SiN_x$), usually deposited by plasma-enhanced chemical vapor deposition (PECVD). $SiN_x$ is used because it is a commonly deposited insulator, not because it is optically engineered for maximizing light output from the device. FIG. 1 shows a typical flip chip architecture. The metallic contacts are opaque and reflecting, and light is extracted from the device from the bottom of the device as oriented in FIG. 1. The p-contact area is typically the majority of the area of the device and is engineered to have high reflectivity. The region around the n-contact is not typically optimized for reflectivity as the p-contact due to the lack of materials available with optical properties that are optimized for this application.

One solution is to add a distributed Bragg reflector (DBR) to provide high efficiency light reflection in the vicinity of the n-contact. DBRs are complex structures requiring a plurality of precisely engineered layer pairs of alternating index of refraction having carefully controlled layer thicknesses. Carlin et al, describe the use of a DBR formed from pairs of layers of $Al_{0.84}In_{0.16}N$ and GaN with near lattice matching between the layers (2003, Appl. Phys. Lett, 83, 668). Precise index matching to GaN is not required, but DBRs are expensive and difficult to make with high yields.

Bhat and Steigerwald (U.S. Pat. No. 6,630,689) describe a highly reflective dielectric stack by forming series of insulating layers with specified high and low indices of refraction to achieve a high reflectivity stack. However, the high reflectivity condition exists only for a limited range of incident angles at only at a specified wavelength of light.

There is a particular need for transparent insulators with a better index match to GaN to improve reduce reflective losses and improve light extraction from the vicinity of the n-contact, It is in this context that the insulators disclosed herein were developed, although it will be apparent to the skilled artisan that such index-matched materials can be used for other embodiments of optoelectronic devices.

SUMMARY OF THE INVENTION

Optoelectronic devices are described comprising a first component comprising a Group III-N semiconductor, and a second component comprising a bimetallic oxide containing tin. The second component has an index of refraction within 15% of the index of refraction of the Group III-N semiconductor, and has negligible extinction coefficient at wavelengths of light emitted or absorbed by the Group III-N semiconductor. The first component is in optical contact with the second component. The first component is in optical contact with the second component. The second component can be used as a transparent insulator. Exemplary oxides include $Sn_{1-x}Bi_xO_2$ where x≅0.10, $Zn_2SnO_2$, $Sn_{1-x}Al_xO_2$ where x≅0.18, $Sn_{1-x}Mg_xO_2$ where x≅0.16.

The devices can be optoelectronic devices such as light-emitting devices or light-sensing devices, The devices can include an omnidirectional reflector comprising a metal layer and the second component as a layer disposed adjacent to and in optical contact with the metal layer, and disposed between the first component and the metal layer. A set of conductive vias can be disposed in the second component to provide conductivity between the metal layer and the first component. The metal layer can comprise Ag or Al.

Methods of making optoelectronic devices with maximal light output are disclosed, comprising the steps of providing an optoelectronic device comprising a Group III-N semiconductor, and depositing a transparent material adjacent to and in optical contact with the Group III-N semiconductor. The transparent material comprises a bimetallic oxide containing tin and has an index of refraction within 15% of the index of refraction of the Group III-N semiconductor, and has negligible extinction coefficient at wavelengths of light emitted or absorbed by the Group III-N semiconductor. The first component is in optical contact with the second component. Exemplary tin-containing bimetallic oxides include $Sn_{1-x}Bi_xO_2$ where x≅0.10, $Zn_2SnO_2$, $Sn_{1-x}Al_xO_2$ where x≅0.18, and $Sn_{1-x}Mg_xO_2$ where x≅0.16. The transparent material can be deposited as a layer by physical vapor deposition.

Methods of making an optoelectronic device are disclosed, A first component comprising a Group III-N semiconductor is provided. A second component is formed adjacent to and in optical contact with the Group III-N semiconductor. The second component comprises a bimetallic oxide containing tin and has an index of refraction within 15% of the index of refraction of the first component at wavelengths of light emitted or absorbed by the Group III-N semiconductor. The second component also has a negligible extinction coefficient at wavelengths of light emitted or absorbed by the Group III-N semiconductor. The optoelectronic device can be a light emitting diode, laser or light sensor. The bimetallic oxide can comprise between 33% and 92% tin by metal atom fraction. The bimetallic oxide can comprise $Sn_{1-x}Bi_xO_2$ where $0.08<x<0.12$; $Zn_2SnO_2$, $Sn_{1-x}Al_xO_2$ where $0.15>x<0.21$; or $Sn_{1-x}Mg_xO_2$ where $0.14<x<0.18$.

A metal layer comprising, for example, Ag or Al, can be formed adjacent to and in optical contact with the transparent component, where the transparent component is disposed between the semiconductor layers and the metal layer. One or more conductive vias can be disposed in the transparent component to provide conductivity between the metal layer and the semiconductor layers.

BRIEF DESCRIPTION OF THE DRAWING

FIG. 1 shows a flip chip LED contact architecture.

DETAILED DESCRIPTION

It must be noted that as used herein and in the claims, the singular forms "a," "and" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. The terms "about" and "approximately" generally refer to ±10% of a stated value.

Exemplary embodiments are described for convenience by reference to GaN semiconductors, but any Group III element can be substituted for Ga. Thus, in the most general sense, semiconductors used in the present invention can be any Group III-N semiconductor, i.e., any semiconductor comprising a Group III element and nitrogen.

DEFINITIONS

As used herein, the term "component" refers to a portion of material used in an optoelectronic device. Components can include barrier layers, electrodes, lenses, insulators, and the like. A component may be in the form of a layer, but is not restricted to layers.

As used herein, the term "distributed Bragg reflector" refers to a structure formed from multiple layers of alternating materials with different index of refraction. Each layer boundary causes a partial reflection of an optical wave. For waves whose wavelength is close to four times the optical thickness of the layers, the many reflections combine with constructive interference, and the layers act as a high-quality reflector.

As used herein, the term "negligible extinction coefficient" is used to describe a material having an extinction coefficient of less than 0.02 at the wavelength of interest.

As used herein, the term "extinction coefficient" refers to the imaginary part of the complex index of refraction.

As used herein, the term "omnidirectional reflector" refers to a structure which reflects light with substantially equal efficiency over a broad range of incident angles. Polished metals are generally omnidirectional reflectors.

As used herein, the term "optical contact" refers to intimate contact between two solid materials such that there is negligible intervening gap, space, liquid, or gas between the two materials. Light moving from one material to the other refracts and reflects based solely on the differences between the two material indices of refraction.

As used herein, the term "oxide" refers generally to a compound containing oxygen and at least one other element. The compound may contain a single additional element (e.g., $Al_2O_3$) or it may contain a more complex mixture of two or more additional materials in either stoichiometric or non-stoichiometric ratios. The term "bimetallic oxide" refers to an oxide containing at least two metals and wherein the atomic ratios (metal to metal or metal to oxygen) can be either stoichiometric or non-stoichiometric.

The present invention discloses methods, compositions, and articles of manufacture employing tin-containing oxides that exhibit an index of refraction that is matched to the index of refraction of a Group III-N semiconductor. Exemplary Group III-N semiconductors include GaN having an index of refraction of n=2.3. The articles of manufacture include optoelectronic devices such as light-emitting devices or light-sensing devices. The devices comprise a first component comprising a Group III-N semiconductor (e.g., GaN), and a second component comprising a bimetallic oxide containing tin. The first component is in optical contact with the second component.

The second component has an index of refraction within 15% of the index of refraction of the first component and has a negligible extinction coefficient at wavelengths of light emitted or absorbed by the semiconductor. For example, for use with GaN, the second component typically exhibits an extinction coefficient of k<0.005 at 450 nm. The oxides can be placed in optical contact with the Group III-N semiconductor to provide index matching at the boundary. The oxides should also be able to retain their useful optical and insulating properties at annealing temperatures commonly used in optoelectronic device processing and packaging; and specifically those temperatures used to process and package GaN based optoeleetronic devices. The second component can be an insulator.

The tin-containing bimetallic oxides can be deposited by a number of deposition methods, including MOCVD, plasma-enhanced chemical vapor deposition (PECVD), and physical vapor deposition (MID). In some embodiments, PVD by sputtering is done at reduced pressure in a partial pressure of oxygen.

Optoelectronic devices are disclose comprising a first component and a second component in optical contact. The first component comprises a Group III-N semiconductor (e.g., GaN), and the second component comprises a bimetallic oxide containing tin having an index of refraction within 15% of the index of refraction of the first component at wavelengths of light emitted or absorbed by the Group III-N semiconductor. Four specific bimetallic oxides with index of refraction greater than 2 and with negligible extinction coefficient were discovered by the present inventors: $Sn_{1-x}Bi_xO_2$ where $x \cong 0.10$ (n=2.3), $Zn_2SnO_2$ (n=2.1-2.2), $Sn_{1-x}Al_xO_2$ where $x \cong 0.18$ (n=2.0), and $Sn_{1-x}Mg_xO_2$ where $x \cong 0.16$ (n=2.0) (all four index of refraction measurements at 400 nm). These four oxides are found to be thermally stable after annealing in air at 600° C., in that they remained amorphous, have index of refraction values greater than 2, and have negligible extinction coefficient.

Methods of making optoelectronic devices with improved optical coupling from a semiconductor material into and through an insulating component are disclosed, comprising the steps of providing an optoelectronic device comprising a Group III-N semiconductor, and depositing a transparent material adjacent to and in optical contact with the Group III-N semiconductor. The transparent material comprises a bimetallic oxide containing tin and having an index of refraction approximately the same as the index of refraction of the semiconductor material, where the transparent material also has negligible extinction coefficient. In some embodiments, the transparent material can be deposited as a layer by physical vapor deposition.

Methods of making optoelectronic devices are disclosed comprising providing a first component comprising a Group III-N semiconductor. A second component is formed adjacent to and in optical contact with the Group III-N semiconductor. The second component comprises a bimetallic oxide containing tin. The second component has an index of refraction within 15% of the index of refraction of the first component at wavelengths of light emitted or absorbed by the Group III-N semiconductor. The second component also has a negligible extinction coefficient at wavelengths of light emitted or absorbed by the Group III-N semiconductor. The optoelectronic device can be a light emitting diode, laser, or light sensing device.

The bimetallic oxide can comprise between 33% and 92% tin by metal atom fraction. The bimetallic oxide can comprise $Sn_{1-x}Bi_xO_2$ where $0.08<x<0.12$; $Zn_2SnO_2$; $Sn_{1-x}Al_xO_2$ where $0.15<x<0.21$; or $Sn_{1-x}Mg_xO_2$ where $0.14<x<0.18$.

A reflective layer, for example, a metal layer comprising Ag or Al, can be formed adjacent to and in optical contact with the second component, wherein the second component is disposed between the semiconductor layers and the metal layer. One or more conductive vias can be disposed in the second component to provide conductivity between the reflective layer and the semiconductor layers.

In some embodiments, the methods include methods for constructing an LED, including flip chip LEDs having ODRs formed from the index matching tin-containing bimetallic oxide components described herein.

APPLICATIONS

Enhanced Light Extraction

Light extraction from optoelectronic devices such as LEDs and lasers is complicated by the high index of refraction of the semiconductor materials used. Large reflection of the emitted light can occur in GaN devices at the semiconductor-air boundary due to the index of refraction mismatch between the semiconductor (n=2.3) and air (n=1). Transparent insulators with index of refraction near 2.3 and negligible extinction coefficient are useful to enable efficient light extraction by reducing internal reflection. Such materials are not currently in use.

For devices that use an internal reflector, the ability to use a material with index of refraction matched to the semiconductor is of value in optoelectronic device design. The insulating material should also have negligible extinction coefficient at operating wavelengths (i.e. wavelengths of light absorbed or emitted by the semiconductor) so that there is negligible absorption in the insulating material. Lastly, the materials should be thermally stable at the processing and packaging temperature of the optoelectronic device, and at the service conditions of the device.

The bimetallic oxides containing tin described herein can be used for these applications. Use of these novel oxides can improve light extraction from light emitting devices (LEDs and lasers) and light sensitivity in light sensing devices.

Omnidirectional Reflectors

Omni-directional reflectors (ODRs) can be used for reflecting contacts for optoelectronic devices, among other applications. They are omnidirectional in that they exhibit high reflectivity over a broad range of angles of incidence. ODRs can be made as precisely engineered optical components with specified layer thicknesses and specified index of refraction for that layer. The thickness of the dielectric is carefully controlled at a value of $\lambda/4$ n (where $\lambda$ is the wavelength of incident light and n is the index of refraction of the dielectric) in order to maximize the reflectivity. The dielectric layer thickness is chosen to be $\lambda/4$ n to achieve high reflectivity at the emitted wavelength of the device and at all angles of incidence to the interface between the semiconductor and the dielectric. Implementation of ODRs involve significant processing, including depositing dielectrics with specified thickness and optical properties, and constructing vias (through the ODR) to provide electrical connection from the semiconductor to the metallic layer. The vias are used in devices where the nonconductive ODR is positioned adjacent to a semiconductor layer in order to reflect light back into the semiconductor layer, and for which it is also necessary to make electrical contact. An array of vias filled with a conductor is disposed in the ODR layer to provide sufficient current paths to connect an electrode layer to the semiconductor.

While this version of an ODR is an elegant optical solution, it relies on interference effects which change when the thickness of the dielectric or its index of refraction are either higher or lower than the designed value. Deviations of the thickness from the target value or deviations in the index of refraction from the expected value will degrade the reflectivity of the ODR. As a result, manufacturing the ODR is challenging. Similarly, if the emitted light deviates from the target wavelength $\lambda$, reflectivity can be reduced, again because the design thickness of the layer will be incorrect for the actual wavelength emitted.

Novel ODRs are disclosed that are less exacting to construct and do not rely on interference effects. These novel ODRs also do not depend on layer thicknesses or the wavelength of the reflected light. In some embodiments, an insulating layer is disposed between a semiconductor layer and a conductor. The insulating layer comprises a tin-containing bimetallic oxide selected to provide refractive index matching to a Group III-N semiconductor (e.g., GaN) layer and high transmissivity through the interface and the insulating layer at the operating wavelengths of the device. Due to the negligible extinction coefficient of the insulating layer, the light is transmitted through the insulating layer to a conducting layer (e.g., a metal layer) which can also serve as a high reflectivity layer. The ODR comprises the insulating layer and the conducting layer. Ag and Al are examples of metals that can provide both good conductivity and high reflectivity at typical operating wavelengths with little or no wavelength sensitivity. Light is reflected back through the index matched dielectric layer into the semiconductor layer. Electrical connection between the Group III-N layer and the metal layer can be provided by including one or more conductive vias.

Accordingly, optoelectronic devices are also disclosed that include an ODR. The devices comprise a first component comprising a Group III-N semiconductor (e.g., GaN), and a second component comprising a bimetallic oxide containing tin; wherein the second component has a refractive index approximately the same as that of the first component, and negligible extinction coefficient at wavelengths of light used in the optoelectronic device, and wherein the first component is in optical contact with the second component. The devices further comprise a metal layer, and the second component is in the form of a layer disposed between the first component and the metal layer and in optical contact with the metal layer. The metal layer can comprise any convenient reflective metal such as Ag or Al. If desired, the devices can further comprise one or more conductive vias disposed in the second component to provide conductivity between the metal layer and the first component.

Flip Chip LED

FIG. 1 shows a typical contact configuration for a GaN flip chip LED. The device has an n-doped GaN layer 100 with a p-doped layer 102 shown above it (plus additional internal layers not shown). Light emanates from the bottom of the device as shown. The device has metallic layers 104 and 106 adjacent to the p-doped layer 102 which form one electrical contact to the device. Layer 104 is a reflecting metal contact, e.g., Ag. All electrical contacts are made from the top of the device. A via is shown etched through layers 102, 106, and 108 to expose the n-doped GaN layer 100. An insulating layer 108 is disposed between layers 110 and 106 to provide electrical isolation between these layers. Contact layer 110 provides for electrical contact to the n-doped GaN layer 100. The material of the contact layer 110 can be a reflective metal such as Al or Ag. In order to maximize reflection from the metal in the vicinity of the n-contact, the insulating layer 108 can be index matched to GaN using one of the tin-containing bimetallic oxides disclosed above.

EXAMPLES

Example 1

Index of Refraction and Extinction Coefficient for Selected Materials

Various samples of tin-containing oxides were prepared by physical vapor deposition (sputtering) in an atmosphere comprising argon and oxygen. Results are shown in Table 1.

TABLE 1

| Materials | Dep rate (Å/s/W × 1000) | Thickness (Å) | n at 400 nm | | k at 400 nm | |
| --- | --- | --- | --- | --- | --- | --- |
| | | | pre-anneal | post-anneal | pre-anneal | post-anneal |
| $Zn_2Sn$, 70% $O_2$ | 4 | 762 | 2.19 | 2.12 | 0.018 | 0.000 |
| $Sn_{0.86}Mg_{0.14}$, 85% $O_2$ | 2.9 | 971 | 2.03 | 2.00 | 0.005 | 0.004 |
| $Sn_{0.82}Al_{0.18}$, 85% $O_2$ | 1.3 | 607 | 2.01 | 1.99 | 0.008 | 0.000 |
| $Sn_{0.90}Bi_{0.10}$, 85% $O_2$ | 4.5 | 763 | 2.31 | 2.28 | 0.016 | 0.000 |

Samples were annealed at 600° C. for 15 minutes in air and analyzed before and after annealing using x-ray diffraction and spectral ellipsometry. The other samples were amorphous both before and after annealing, although the tin-bismuth oxide showed a small amount of crystallization after annealing that had negligible effect on the optical properties.

It will be understood that the descriptions of one or more embodiments of the present invention do not limit the various alternative, modified and equivalent embodiments which may be included within the spirit and scope of the present invention as defined by the appended claims. Furthermore, in the detailed description above, numerous specific details are set forth to provide an understanding of various embodiments of the present invention. However, one or more embodiments of the present invention may be practiced without these specific details. In other instances, well known methods, procedures, and components have not been described in detail on as not to unnecessarily obscure aspects of the present embodiments.

The invention claimed is:

1. An optoelectronic device comprising
   a first component comprising a Group III-N semiconductor, and
   a second component comprising a bimetallic oxide containing tin;
   wherein the first component is in optical contact with the second component;
   wherein the second component has an index of refraction within 15% of the index of refraction of the first component at wavelengths of light emitted or absorbed by the Group III-N semiconductor;
   wherein the second component has a negligible extinction coefficient at wavelengths of light emitted or absorbed by the Group III-N semiconductor; and
   wherein the bimetallic oxide comprises one of $Zn_2SnO_2$, $Sn_{1-x}Bi_xO_2$ having $0.08<x<0.12$, $Sn_{1-x}Al_xO_2$ having $0.15<x<0.21$, or $Sn_{1-x}Mg_xO_2$ having $0.14<x<0.18$.

2. The optoelectronic device of claim 1, wherein the bimetallic oxide comprises between 33% and 92% tin by metal atom fraction.

3. The optoelectronic device of claim 1, wherein the optoelectronic device is a light-emitting device or a light-sensing device.

4. The optoelectronic device of claim 1, further comprising a metal layer,
   wherein the second component is a layer disposed adjacent to and in optical contact with the metal layer, and
   wherein the second component is disposed between the first component and the metal layer.

5. The optoelectronic device of claim 4, further comprising one or more conductive vias disposed in the second component to provide conductivity between the metal layer and the first component.

6. The optoelectronic device of claim 4, wherein the metal layer comprises Ag or Al.

7. A method of making an optoelectronic device, the method comprising
   providing a first component comprising a Group III-N semiconductor,
   forming a second component adjacent to and in optical contact with the Group III-N semiconductor,
   wherein the second component comprises a bimetallic oxide containing tin;

wherein the second component has an index of refraction within 15% of the index of refraction of the Group III-N semiconductor at wavelengths of light emitted or absorbed by the Group III-N semiconductor;

wherein the second component has a negligible extinction coefficient at wavelengths of light emitted or absorbed by the Group III-N semiconductor and wherein the bimetallic oxide comprises one of $Zn_2SnO_2$, $Sn_{1-x}Bi_xO_2$ having $0.08<x<0.12$, $Sn_{1-x}Al_xO_2$ having $0.15<x<0.21$, or $Sn_{1-x}Mg_xO_2$ having $0.14<x<0.18$.

8. The method of claim 7, wherein the optoelectronic device is a light emitting diode, a laser, or a light sensor.

9. The method of claim 7, wherein the bimetallic oxide comprises between 33% and 92% tin by metal atom fraction.

10. The method of claim 7, further comprising forming a metal layer adjacent to and in optical contact with the second component, wherein the second component is disposed between the semiconductor and the metal layer.

11. The method of claim 10, further comprising forming one or more conductive vias disposed in the second component to provide conductivity between the metal layer and the semiconductor.

12. The method of claim 10, wherein the metal layer comprises Ag or Al.

* * * * *